United States Patent
Chien

(10) Patent No.: US 9,473,099 B2
(45) Date of Patent: Oct. 18, 2016

(54) RF SIGNAL AUTOMATIC GAIN CONTROL METHOD

(71) Applicant: Chih-Chien Chien, New Taipei (TW)

(72) Inventor: Chih-Chien Chien, New Taipei (TW)

(*) Notice: Subject to any disclaimer, the term of this patent is extended or adjusted under 35 U.S.C. 154(b) by 288 days.

(21) Appl. No.: 14/325,786

(22) Filed: Jul. 8, 2014

(65) Prior Publication Data

US 2015/0200642 A1    Jul. 16, 2015

(51) Int. Cl.
| | | |
|---|---|---|
| *H04B 7/00* | (2006.01) | |
| *H04W 72/00* | (2009.01) | |
| *H04L 27/00* | (2006.01) | |
| *H03G 3/30* | (2006.01) | |

(52) U.S. Cl.
CPC .................................. *H03G 3/3036* (2013.01)

(58) Field of Classification Search
CPC .... H03G 3/3036; H03G 3/30; H03G 3/3052; H04B 1/1027; H04B 1/109; H04B 7/00; H04W 88/06; H04W 16/14; H04W 72/082; H04L 27/08
See application file for complete search history.

(56) References Cited

U.S. PATENT DOCUMENTS

| | | | | |
|---|---|---|---|---|
| 7,065,335 B2 * | 6/2006 | Ben-Ayun | ............ | H03G 3/3078 455/136 |
| 7,184,730 B2 * | 2/2007 | Hughes | ................ | H03G 3/3068 375/345 |
| 7,536,159 B2 * | 5/2009 | Razzell | .................. | H03G 3/001 330/254 |
| 7,596,193 B2 * | 9/2009 | Kang | .................. | H03G 3/3078 375/345 |
| 7,668,517 B2 * | 2/2010 | Li | .......................... | H04W 52/52 455/136 |
| 8,306,550 B2 * | 11/2012 | Sadek | .................. | H03G 3/3052 455/234.1 |
| 8,565,358 B2 * | 10/2013 | Komaili | .............. | H04L 27/3809 375/345 |
| 8,605,836 B2 * | 12/2013 | Murthy | ................ | H03G 3/3068 375/345 |
| 2004/0009758 A1 * | 1/2004 | Graham | ............... | H03G 3/3052 455/234.1 |

* cited by examiner

*Primary Examiner* — Pablo Tran

(57) ABSTRACT

The automatic gain control (AGC) method contains the following steps: producing a feedback signal and transmitting the feedback signal to a signal processing unit to produce a working signal; transmitting the working signal to a first signal control unit to produce a first control voltage; transmitting the first control voltage to a second signal control unit to produce a second control voltage, which is a fixed voltage; and transmitting the second control voltage to an AGC unit where the fixed second control voltage is used as a reference value. As such, when a radio-frequency (RF) input signal varies due to channel loading variation, an RF output signal by the AGC unit can be maintained within a specified dB range.

17 Claims, 4 Drawing Sheets

RF SIGNAL AUTOMATIC GAIN CONTROL METHOD

BACKGROUND OF THE INVENTION (a) Technical Field of the Invention

The present invention is generally related to an automatic gain control method for radio-frequency (RF) signal, and more particular to a RF signal automatic grain control method capable of maintaining RF output signal within a specified dB range.

(b) Description of the Prior Art

Electronic devices are often operated under various control circuits to achieve desired performance. Feedback is a major mechanism utilized by numerous control circuits and therefore they are often named as feedback control circuits. The so-called automatic gain control (AGC) circuit is one such control circuit.

AGC circuit is commonly applied in radio-frequency (RF) reception devices. This is due to that RF signal suffers significant fluctuation resulted from factors like multiple paths and attenuation in the transmission process. The AGC circuit is used to maintain the stability of RF output signal's dB value.

For conventional AGC circuit, once channel loading to the RF input signal changes, a reference value fed back by the AGC circuit has to be manually adjusted to as to maintain the stability of RF output signal's dB value, which is cumbersome to operation personnel.

SUMMARY OF THE INVENTION

To obviate the shortcomings of prior art, a novel automatic gain control (AGC) method is provided herein. The AGC method contains the following steps: producing a feedback signal and transmitting the feedback signal to a signal processing unit to produce a working signal; transmitting the working signal to a first signal control unit to produce a first control voltage; transmitting the first control voltage to a second signal control unit to produce a second control voltage, which is a fixed voltage; and transmitting the second control voltage to an AGC unit where the fixed second control voltage is used as a reference value. As such, when a radio-frequency (RF) input signal varies due to channel loading variation, an RF output signal by the AGC unit can be maintained within a specified dB range.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.
Many other advantages and features of the present invention will become apparent to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
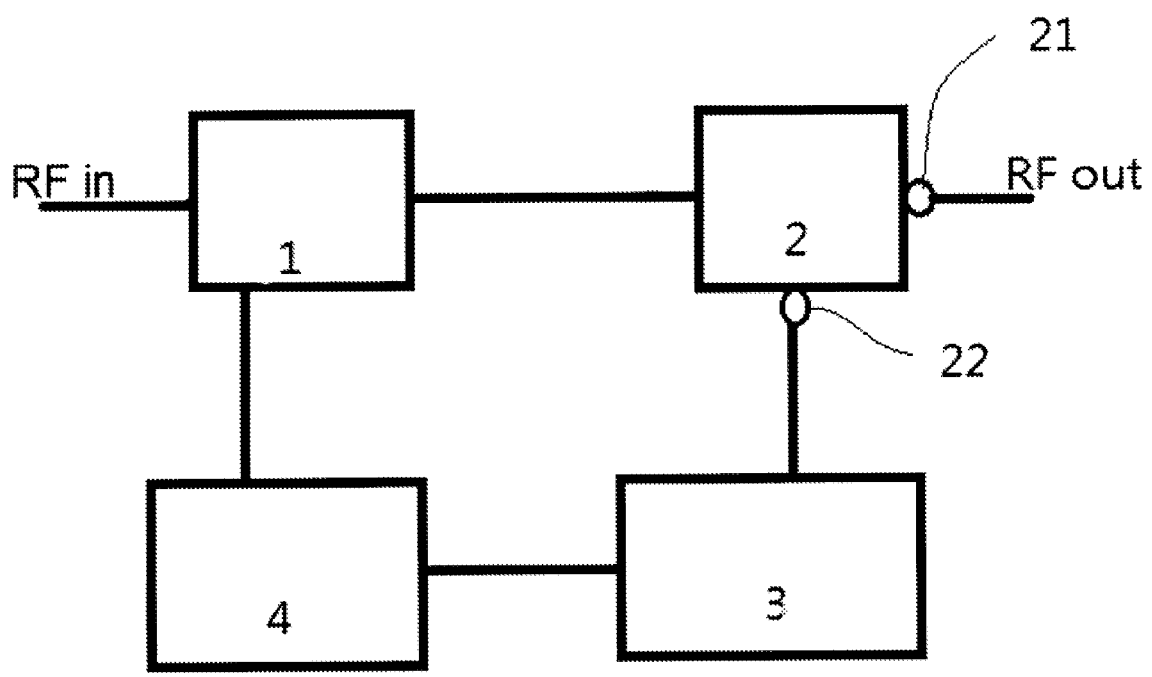
FIG. 1 is a functional block diagram showing an automatic grain control (AGC) system according to the present invention.
Figure 2:
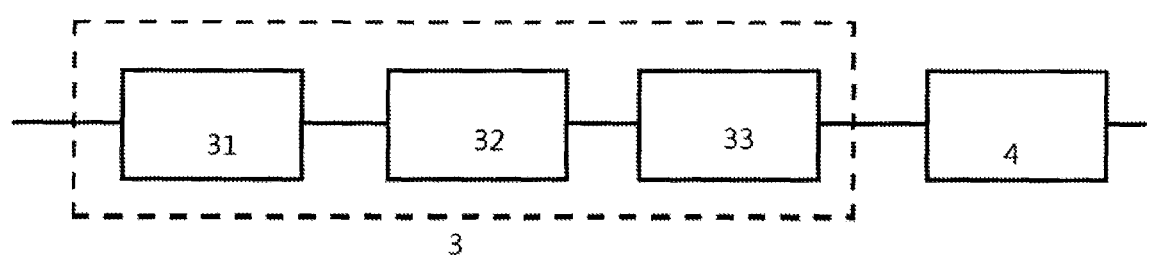
FIG. 2 is a function block diagram showing an AGC circuit of the AGC system of FIG. 1.
Figure 3:
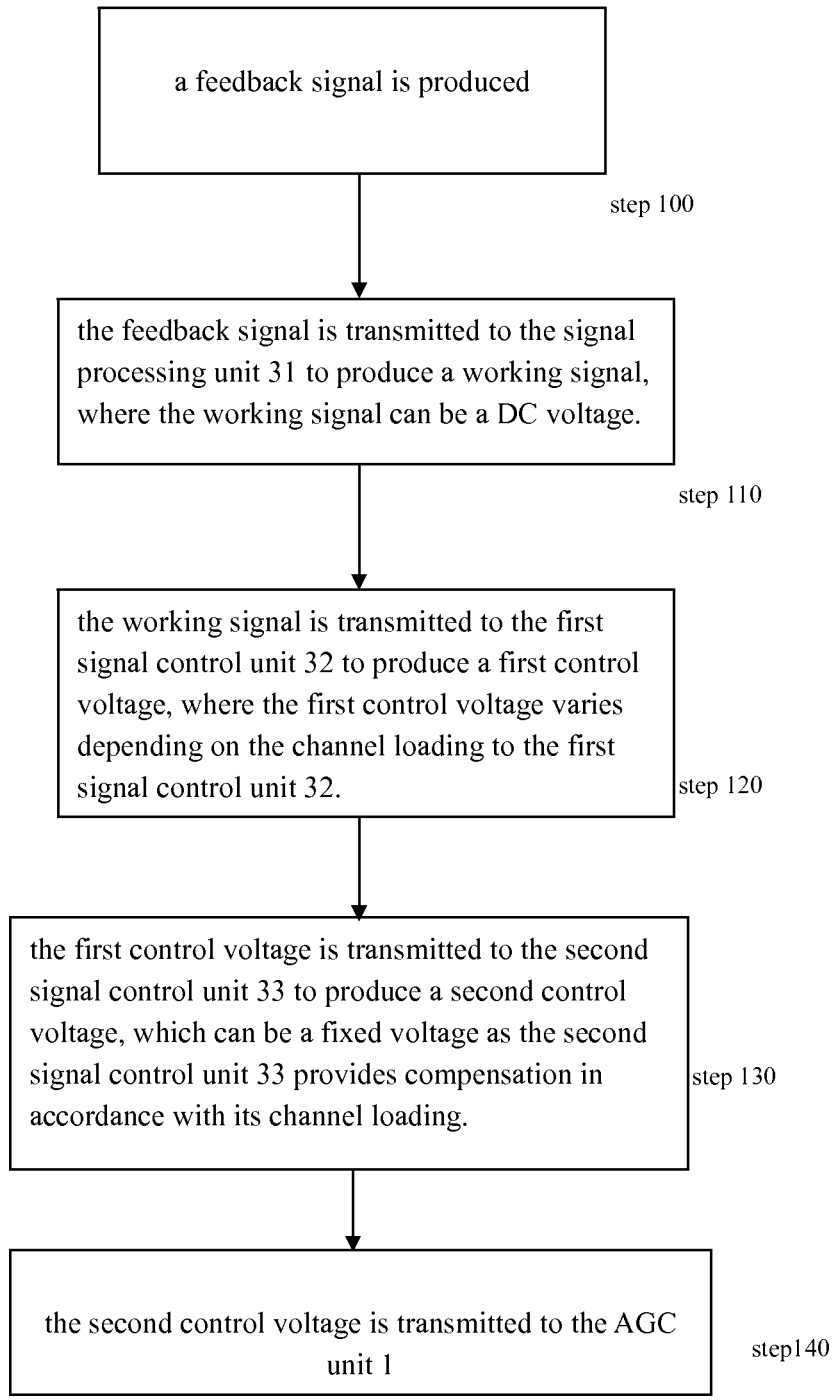
FIG. 3 is a flow diagram showing the steps of an AGC control method according to an embodiment of the present invention.

As shown in FIGS. 1 to 3, an automatic gain control (AGC) method for radio-frequency (RF) signal according to the present invention is implemented in an AGC system which contains an AGC unit 1, a distributor 2, an AGC circuit 3, and a selector 4.

The AGC unit 1 is to adjust the strength of an input RF signal.

The distributor 2 is electrically connected to an output terminal of the AGC unit 1, and produces a feedback signal. The distributor 2 has a first output terminal 21 and a second output terminal 22. An output RF signal is provided on the first output terminal 21 and the feedback signal is provided on the second output terminal 22.

The AGC circuit 3 is electrically connected to the second output terminal 22 of the distributor 2. The AGC circuit 3 contains a signal processing unit 31, a first signal control unit 32, and a second signal control unit 33. The signal processing unit 31 receives the feedback signal from the distributor 2, and produces a working signal as output. The first signal control unit 32 is electrically connected to an output terminal of the signal processing unit 31 and receives the working signal. The first signal control unit 32 converts the working signal into a first control voltage as output. The first signal control unit 32 varies the first control voltage according to its channel loading. The second signal control unit 33 is electrically connected to an output terminal of the first signal control unit 32 and to the AGC unit 1. The second signal control unit 33 receives the first control voltage from the first signal control unit 32 and converts the first control voltage into a second control voltage according to the channel loading of the second signal control unit 33. As the second signal control unit 33 provides compensation according to its channel loading, the second control voltage is a fixed voltage. The second control voltage is then transmitted to the AGC unit 1.

The selector 4 is electrically connected to the AGC circuit 3 and the AGC unit 1. More specifically, the selector 4 is electrically connected to an output terminal of the second signal control unit 33 and to the AGC unit 1. The selector 4 allows one of an AGC signal or a RGC signal to pass, and transmits the second control voltage.

As shown in FIG. 3, an AGC method according to an embodiment of the present invention contains the following steps.

In step 100, a feedback signal is produced.

In step 110, the feedback signal is transmitted to the signal processing unit 31 to produce a working signal, where the working signal can be a DC voltage.

In step 120, the working signal is transmitted to the first signal control unit 32 to produce a first control voltage, where the first control voltage varies depending on the channel loading to the first signal control unit 32.

In step 130, the first control voltage is transmitted to the second signal control unit 33 to produce a second control voltage, which can be a fixed voltage as the second signal control unit 33 provides compensation in accordance with its channel loading.

In step 140, the second control voltage is transmitted to the AGC unit 1.

If the RF input signal is an AGC signal, the second control voltage produced by the second signal control unit 33 can be directly transmitted to the AGC unit 1 as a reference value. As such, when the RF input signal varies due to channel loading variation, the RF output signal by the AGC unit 1 through the first output terminal 21 of the distributor 2 can be maintained within a specified dB range.

Figure 4:
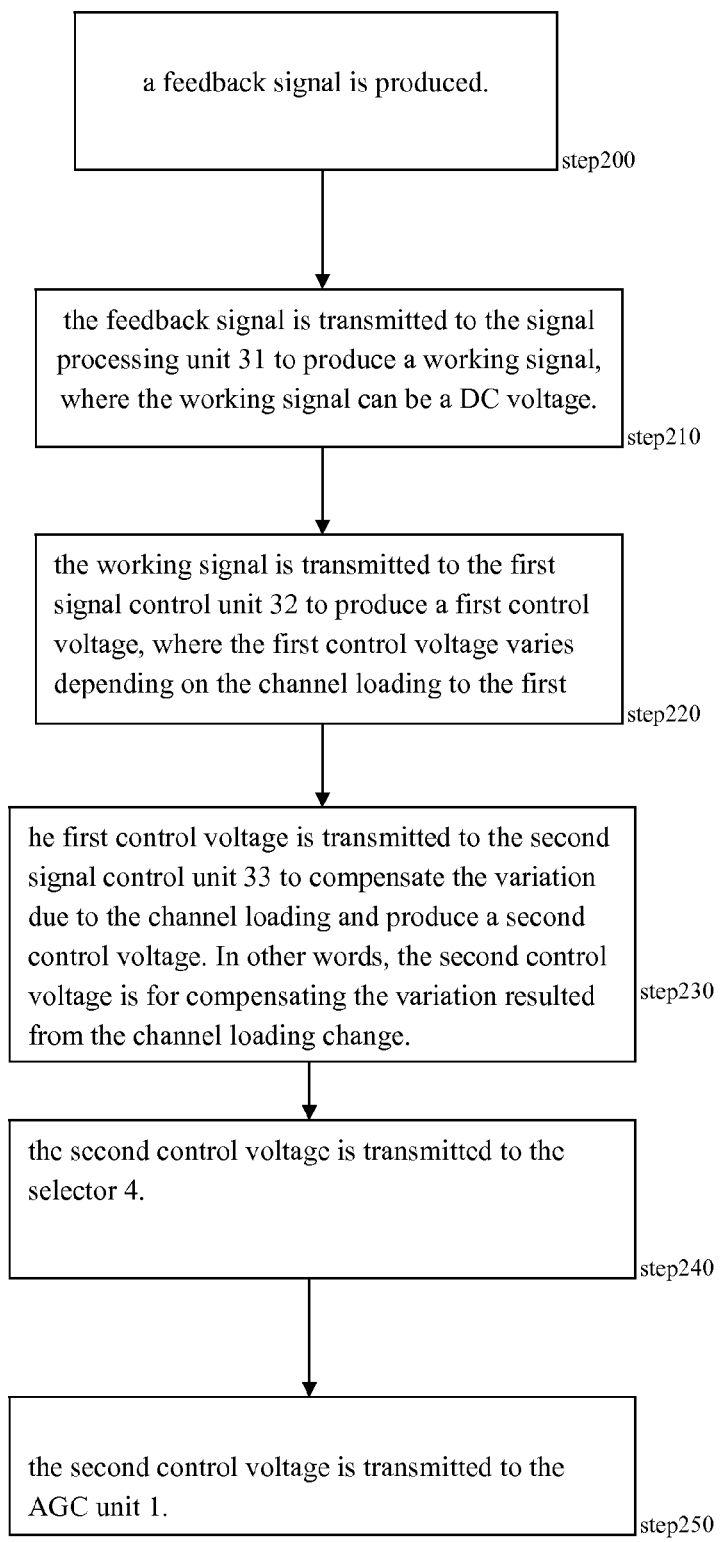
FIG. 4 is a flow diagram showing the steps of an AGC control method according to another embodiment of the present invention.

As shown in FIG. 4, an AGC method according to another embodiment of the present invention contains the following steps.

In step 200, a feedback signal is produced.

In step 210, the feedback signal is transmitted to the signal processing unit 31 to produce a working signal, where the working signal can be a DC voltage.

In step 220, the working signal is transmitted to the first signal control unit 32 to produce a first control voltage, where the first control voltage varies depending on the channel loading to the first signal control unit 32.

In step 230, the first control voltage is transmitted to the second signal control unit 33 to compensate the variation due to the channel loading and produce a second control voltage. In other words, the second control voltage is for compensating the variation resulted from the channel loading change.

In step 240, the second control voltage is transmitted to the selector 4.

In step 250, the second control voltage is transmitted to the AGC unit 1.

Alternatively, the selector 4 is for selecting an AGC control signal or a RGC control signal to pass, and transmits the second control voltage which is a fixed voltage to the AGC unit 1. The fixed second control voltage is as a reference value so that, when the RF input signal varies, the RF output signal by the AGC unit 1 through the first output terminal 21 of the distributor 2 can be maintained within a specified dB range.

In the above steps 120 and 220, when the first control voltage is under a fully channel loaded condition, the first control voltage is transmitted to the second signal control unit 33, which directly produces the second control voltage.

In the above steps 120 and 220, when the first control voltage is under a not fully channel loaded condition, the first control voltage is transmitted to the second signal control unit 33, where the second signal control unit 33 produces the second control voltage in accordance with a pre-determined adjustment method. The adjustment method can be one by digitally setting a preset voltage to the second signal control unit 33, or one by manually setting a preset voltage to the second signal control unit 33.

The AGC circuit can further contain a signal average unit electrically connected between the first and second signal control units 32 and 33. The first control voltage produced by the first signal control unit 32 is first transmitted into the signal average unit, and then into the second signal control unit 33 so as to produce the second control voltage. Under this condition, the second signal control voltage can be a Quadrature Amplitude Modulation (QAM) signal. While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A radio-frequency (RF) signal automatic gain control method, comprising the steps of:
producing a feedback signal;
transmitting the feedback signal to a signal processing unit where a working signal is produced;
transmitting the working signal to a first signal control unit where a first control voltage is produced;
transmitting the first control voltage to a second signal control unit where a second control voltage is produced; and
transmitting the second control voltage to a selector where the selector selects an automatic gain control (AGC) control signal or a RGC control signal to pass, and transmits the second control voltage to an AGC unit.

2. The RF signal automatic gain control method according to claim 1, wherein the feedback signal is produced by the AGC unit after the AGC unit receives a RF input signal and transmits the RF input signal to a distributor.

3. The RF signal automatic gain control method according to claim 1, wherein, when the first control voltage is under a fully channel loaded condition, the first control voltage is transmitted to the second signal control unit, which directly produces the second control voltage.

4. The RF signal automatic gain control method according to claim 1, wherein, when the first control voltage is under a not fully channel loaded condition, the first control voltage is transmitted to the second signal control unit, where the second signal control unit produces the second control voltage in accordance with a pre-determined adjustment method.

5. The RF signal automatic gain control method according to claim 4, wherein the adjustment method is a method of digitally setting a preset voltage to the second signal control unit.

6. The RF signal automatic gain control method according to claim 4, wherein the adjustment method is a method of manually setting a preset voltage to the second signal control unit.

7. The RF signal automatic gain control method according to claim 1, wherein the first control voltage produced by the first signal control unit is first transmitted into a signal average unit, and then into the second signal control unit so as to produce the second control voltage.

8. The RF signal automatic gain control method according to claim 7, wherein the second control voltage is a Quadrature Amplitude Modulation (QAM) signal.

9. The RF signal automatic gain control method according to claim 1, wherein the feedback signal is produced by the AGC unit after the AGC unit receives a RF input signal and transmits the RF input signal to a distributor.

10. The RF signal automatic gain control method according to claim 1, wherein, when the first control voltage is under a fully channel loaded condition, the first control voltage is transmitted to the second signal control unit, which directly produces the second control voltage.

11. The RF signal automatic gain control method according to claim 1, wherein, when the first control voltage is under a not fully channel loaded condition, the first control voltage is transmitted to the second signal control unit, where the second signal control unit produces the second control voltage in accordance with a pre-determined adjustment method.

12. The RF signal automatic gain control method according to claim 11, wherein the adjustment method is a method of digitally setting a preset voltage to the second signal control unit.

13. The RF signal automatic gain control method according to claim 11, wherein the adjustment method is a method of manually setting a preset voltage to the second signal control unit.

14. A radio-frequency (RF) signal automatic gain control method, comprising the steps of:
producing a feedback signal;
transmitting the feedback signal to a signal processing unit where a working signal is produced;
transmitting the working signal to a first signal control unit where a first control voltage is produced;
transmitting the first control voltage to a second signal control unit where a second control voltage is produced and the second control voltage is a fixed voltage; and
transmitting the second control voltage to an automatic gain control (AGC) unit.

15. The RF signal automatic gain control method according to claim 14, wherein, when the first control voltage is under a fully channel loaded condition, the first control voltage is transmitted to the second signal control unit, which directly produces the second control voltage.

16. The RF signal automatic gain control method according to claim 14, wherein, when the first control voltage is under a not fully channel loaded condition, the first control voltage is transmitted to the second signal control unit, where the second signal control unit produces the second control voltage in accordance with a pre-determined adjustment method.

17. The RF signal automatic gain control method according to claim 14, wherein the feedback signal is produced by the AGC unit after the AGC unit receives a RF input signal and transmits the RF input signal to a distributor.

* * * * *